(12) United States Patent  (10) Patent No.: US 6,963,252 B2
Kasperkovitz  (45) Date of Patent: Nov. 8, 2005

(54) CONTROLLABLE OSCILLATOR WITH AMPLITUDE STABILIZATION

(75) Inventor: Wolfdietrich Georg Kasperkovitz, Waalre (NL)

(73) Assignee: Semiconductors Ideas to Market B.V., Drielindendreef (NL)

( * ) Notice: Subject to any disclaimer, the term of this patent is extended or adjusted under 35 U.S.C. 154(b) by 104 days.

(21) Appl. No.: 10/474,991

(22) PCT Filed: Apr. 12, 2002

(86) PCT No.: PCT/EP02/04174

§ 371 (c)(1),
(2), (4) Date: Jan. 15, 2004

(87) PCT Pub. No.: WO02/087069

PCT Pub. Date: Oct. 31, 2002

(65) Prior Publication Data

US 2005/0068120 A1 Mar. 31, 2005

(30) Foreign Application Priority Data

Apr. 20, 2001 (EP) .......................... 01201441

(51) Int. Cl.[7] ............................... H03B 5/12
(52) U.S. Cl. .................... 331/108 B; 331/74; 331/135; 331/177 R; 331/183; 331/45
(58) Field of Search ............................. 331/177 R, 183, 331/74, 108 B, 135, 45

(56) References Cited

U.S. PATENT DOCUMENTS

| | | | |
|---|---|---|---|
| 4,188,593 A | | 2/1980 | Kaplan .................... 331/108 D |
| 4,973,920 A | * | 11/1990 | Kasperkovitz ............... 331/45 |
| 5,093,635 A | | 3/1992 | Kasperkovitz et al. .. 331/108 B |
| 6,064,277 A | * | 5/2000 | Gilbert .................... 331/117 R |

* cited by examiner

Primary Examiner—Arnold Kinkead
(74) Attorney, Agent, or Firm—Robert M. McDermott, Esq

(57) ABSTRACT

Controllable oscillator circuit comprising a regenerative loop which incorporates a cascade circuit of first and second sections each having a controllable gain and a phase shift which is 90° at the oscillation frequency, the first and second sections comprising first and second transconductance amplifiers, respectively, outputs of which are coupled to third and fourth transconductance amplifiers, which are positively fed back from the output to the input, and via first and second capacitors to inputs of the second and first gain controlled amplifiers, said first and second capacitors being coupled in parallel to first and second load resistors, respectively, a tuning control current being supplied to control inputs of the first and second transconductance amplifiers, the output of at least one of the first and second transconductance amplifiers being coupled to an amplitude detection arrangement providing a gain control current for an automatic gain control to control inputs of the third and fourth transconductance amplifiers, said first and third transconductance amplifiers of the first section having a differential pair of first and second output terminals in common, said second and fourth transconductance amplifiers of the second section having a differential pair of third and fourth output terminals in common. In order to provide an oscillator capable of generating sinusoidal signals and tuneable at lower tuning frequencies and operating at lower supply voltages than the above conventional oscillator circuit, said first and second parallel RC filters are coupled between the first and second output terminals and the third and fourth output terminals, respectively, said first to fourth output terminals being respectively coupled to first to fourth DC current paths shunting at least a substantial part of said tuning and gain control currents to a supply voltage.

11 Claims, 3 Drawing Sheets

CONTROLLABLE OSCILLATOR WITH AMPLITUDE STABILIZATION

The invention relates to a controllable oscillator circuit comprising a regenerative loop which incorporates a cascade circuit of first and second sections each having a controllable gain and a phase shift which is 90° at the oscillation frequency, the first and second sections comprising first and second transconductance amplifiers, respectively, outputs of which are coupled to third and fourth transconductance amplifiers, which are positively fed back from the output to the input, and via first and second capacitors to inputs of the second and first gain controlled amplifiers, said first and second capacitors being coupled in parallel to first and second load resistors, respectively, a tuning control current being supplied to control inputs of the first and second transconductance amplifiers, the output of at least one of the first and second transconductance amplifiers being coupled to an amplitude detection arrangement providing a gain control current for an automatic gain control to control inputs of the third and fourth transconductance amplifiers said first and third transconductance amplifiers of the first section having a differential pair of first and second output terminals in common, said second and fourth transconductance amplifiers of the second section having a differential pair of third and fourth output terminals in common. Such controllable oscillator circuit provides a pair of phase quadrature sinusoidal oscillatorsignals and is known from U.S. Pat. No. 5,093,635, which is herein incorporated by reference.

The tuning range of the known oscillator is limited at the lower and upper boundaries by the requirement of a low supply voltage. As known, a decrease in the tuning frequency is obtained by decreasing both fling and gain control currents. Furthermore, to prevent the oscillator from functioning as a fop flop, the tuning control current has to be greater than the gain control current within the tuning range at all times. The minimum gain control current is approximately defined by 25 mV/R, in which R is the resistance value of first and second load resistors. Consequently, to decrease the minimum gain control current and therewith the lowest or minimum tuning frequency fmin of the tuning range, the resistance value R of the load resistors has to increase. This, however, limits the upper boundary of the tuning range, in that for high oscillation frequencies the timing control current has to be large and along therewith also the gain control current. The higher the upper boundary of the tuning range or maximum tuning frequency fmax, the larger the tuning and gain control currents and the larger the voltage drop across the load resistors. In particular so at large resistance values R of the load resistors values. The known oscillator can therefore be extended in its tuning range only by an increase of the supply voltage.

It is an object of the invention to provide an oscillator capable of generating sinusoidal signals within a tuning range having a fmax/fmin quotient, much larger than the fmax/fmin quotient of the known oscillator, at a relatively low supply voltage.

Now therefore, according to one of its aspects the invention is characterized by said first and second load resistors being coupled between the first and second output terminals and the third and fourth output terminals, respectively, said first to fourth output terminals being respectively coupled to first to fourth DC current paths shunting at least a substantial part of said tuning and gain control currents to a supply voltage.

The invention is based on the recognition that the load resistors provide a DC function in the biasing of the oscillator and an AC function in the regenerative signal processing as part of the parallel RC filters. By an appropriate separation of these functions, the above conflict in requirements arising when tuning frequency is increased and supply voltage are being reduced, is prevented from occurring.

The above measure according to the invention results in the first to fourth DC current paths carrying at least the greater part of the tuning and gain control currents of the oscillator, whereas the load resistors are mainly effective in the AC signal processing of the oscillator and hardly not in the biasing thereof. The resistance value R of the load resistors can therefore be chosen at relatively very high values allowing to reduce the gain and tuning control currents dramatically, and in this way the lowest value of the oscillation frequency, which is proportional to the tuning control current.

Preferably, said first to fourth DC current paths comprising first to fourth controlled DC current sources, respectively, said first and second controlled DC current sources and said third and fourth controlled DC current sources providing DC currents corresponding to substantially half the summation of said tuning and gain control currents of each section.

This measure allows accurate control in shunting of the gain and tuning control currents to the bias voltage.

A first preferred embodiment, in which feed back control is applied to secure such accurate shunting, is characterized in that the first and second load resistors are being provided by a serial arrangement of a pair of mutually substantially equal resistances, the DC voltage level at the common node between the resistances of said first and second load resistors being negatively fed back to control inputs of the respective first to fourth controlled DC current sources.

By applying this measure, the DC voltage at the common node is used to derive a control signal for the controlled DC current sources.

Preferably, said common node is coupled to an input of a control signal generating device, comprising a comparator for comparing said DC voltage level with a set level to provide a current control signal to the respective first to fourth controlled DC current sources for a negative feedback of signal differences between said DC voltage level and said set level.

A second preferred embodiment, in which feed forward control is applied to secure said accurate shunting is characterized by gain and tuning current mirror means, inputs thereof being supplied with said gain and tuning control currents, respectively, outputs thereof coupled through summation means to control inputs of said first to fourth controlled DC current sources, respectively.

Preferably the first and second load resistors are provided by a serial arrangement of a pair of mutually substantially equal resistances, the common node between the pair of resistances of said first and second load resistors being coupled to a reference voltage.

These and further aspects and advantages of the invention will be cussed more in detail hereinafter with reference to the disclosure of preferred embodiments, and in particular with reference to the appended Figures in which like reference numerals refer to like elements wherein.

Figure 1:
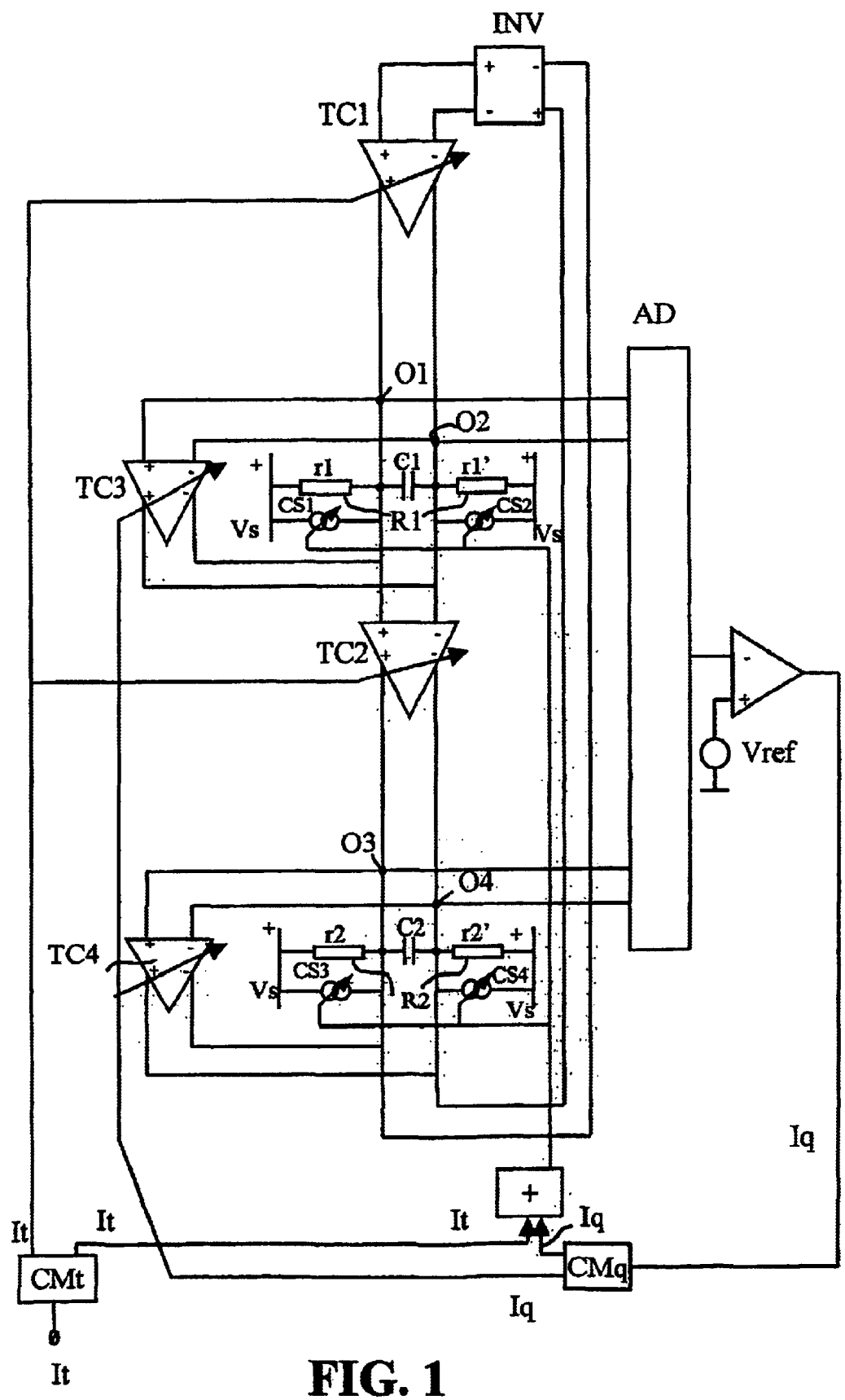
FIG. 1 is a block diagram of an oscillator circuit according to the invention.

FIG. 1 shows a controllable oscillator circuit according to the invention comprising a regenerative loop which incorporates a cascade circuit of first and second sections TC1, TC3, R1C1 and TC2, TC4, R2C2, each having a controllable gain and a phase shift which is 90° at the oscillation frequency. The first and second sections TC1, TC3, R1C1 and TC2, TC4, R2C2 comprise first and second transconductance amplifiers TC1 and TC2, respectively, outputs O1, O2 and O3, O4 of which are coupled to third and fourth transconductance amplifiers TC3 and TC4, which are positively fed back from the output to the input, and via first and second capacitors C1 and C2 and an inverter INV to inputs of the second and first gain controlled amplifiers TC2 and TC1.

A tuning control current It is supplied to control inputs of the first and second transconductance amplifiers TC1 and TC2. The outputs of both first and second transconductance amplifiers TC1 and TC2 are coupled to an amplitude detection arrangement AD providing a gain control current Iq for an automatic gain control to control inputs of the third and fourth transconductance amplifiers TC3 and TC4. Said first and third transconductance amplifiers TC1 and TC3 of the first section TC1, TC3, R1C1 have a differential pair of first and second output terminals O1, O2 in common, said second and fourth transconductance amplifiers TC2 and TC4 of the second section have a differential pair of third and fourth output terminals O3, O4 in common. The first capacitor C1 is coupled between the first and second output terminals O1 and O2 and the second capacitor C2 is coupled between the third and fourth output terminals O3 and O4.

First and second load resistors R1 and R2 are constituted by a serial arrangement of a pair of mutually substantially equal resistances r1, r1' and r2, r2' respectively, each providing half the resistance value of each of said resistors R1 and R2. Said resistances r1, r1' are AC coupled in parallel to the first capacitor C1 and DC coupled to a supply voltage Vs. Likewise, said resistances r2, r2' are AC coupled in parallel to the second capacitor C2 and DC coupled to said supply voltage Vs. This causes the DC voltage at the first and second output teals O1 and O2 and the DC voltage at the third and fourth output terminals O3 and O4 to vary with the tuning and gain control currents It and Iq. The higher the oscillation frequency the larger the voltage drop across these resistances r1, r1' and r2, r2' and the lower the voltage left for biasing the various transconductance amplifiers. The oscillator described sofar is on itself known For further details, reference is made to the above cited U.S. Pat. No. 5,093,635.

According to the invention, however, the resistances r1 and r1' of said first load resistors R1 are substantially freed from DC currents passing through This is obtained by the use of first to fourth DC current paths shunting at least a substantial part of said tuning and gain control currents to said supply voltage. These DC current paths comprise first to fourth controlled DC current sources CS1 to CS4, respectively, said first and second controlled DC current sources CS1 and CS2 and said third and fourth controlled DC current sources CS3 and CS4 providing DC currents corresponding to substantially half the summation of said tuning and gain control currents It and Iq of each section TC1, TC3, R1C1 and TC2, TC4, R2C2.

The current control signal needed for the controlled DC current sources CS1 to CS4 to provide said DC currents is obtained by the summation of mirrored copies of the tuning and gain control currents. For this purpose, the AGC signal current Iq is being supplied to an input of a gain control current mirror CMq, whereas the tuning control current It is being supplied to an input of a tuning control current mirror CMt. The gain control current mirror CMq provides a pair of mutually identical gain control current Iq, the one being supplied to control inputs of the third and fourth transconductance amplifiers TC3 and TC4, the other being supplied to a first input of a summation device SUM The tuning control current mirror CMt provides a pair of mutually identical tuning control current It, the one being supplied to control inputs of the first and second transconductance amplifiers TC1 and TC2, the other being supplied to a second input of a summation device SUM. An output of the summation device SUM is coupled in common to control inputs of the first to fourth controlled DC current sources CS1–CS4, varying the DC currents provided by these DC current sources to correspond to substantially half the summation of said tuning and gain control currents It and Iq of each section TC1, TC3, R1C1 and TC2, TC4, R2C2. This substantially reduces the DC current through the resistances r1, r1' and r2, r2', therewith allowing to dramatically increase these resistances and therewith the tuning range of the oscillator, while fax the DC bias voltage at the outputs O1, O1' and O2, O2'.

Figure 2:
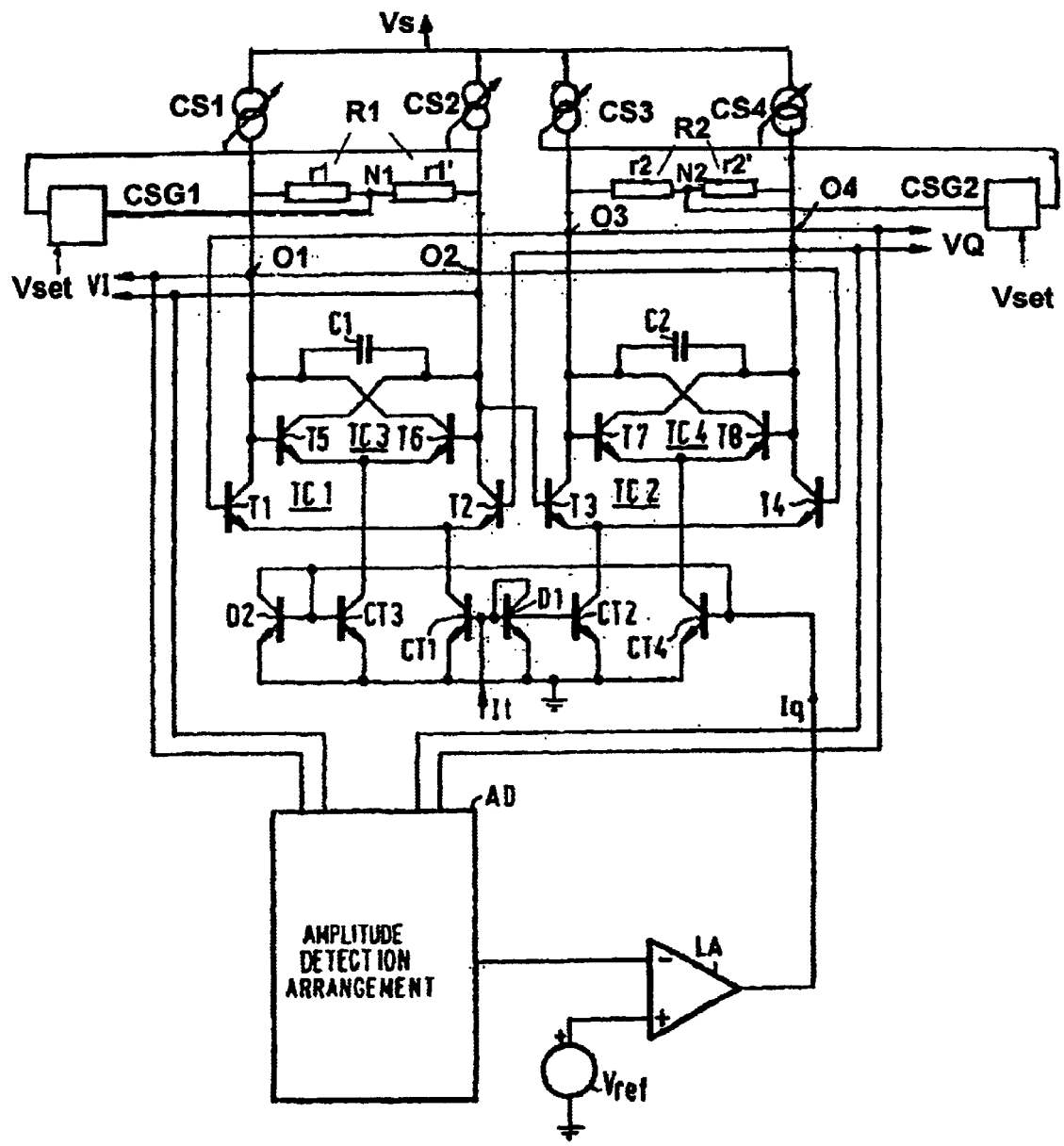
FIG. 2 is a schematic diagram of a first preferred embodiment of an oscillator circuit according to the invention having a DC feedback loop.
Figure 3:
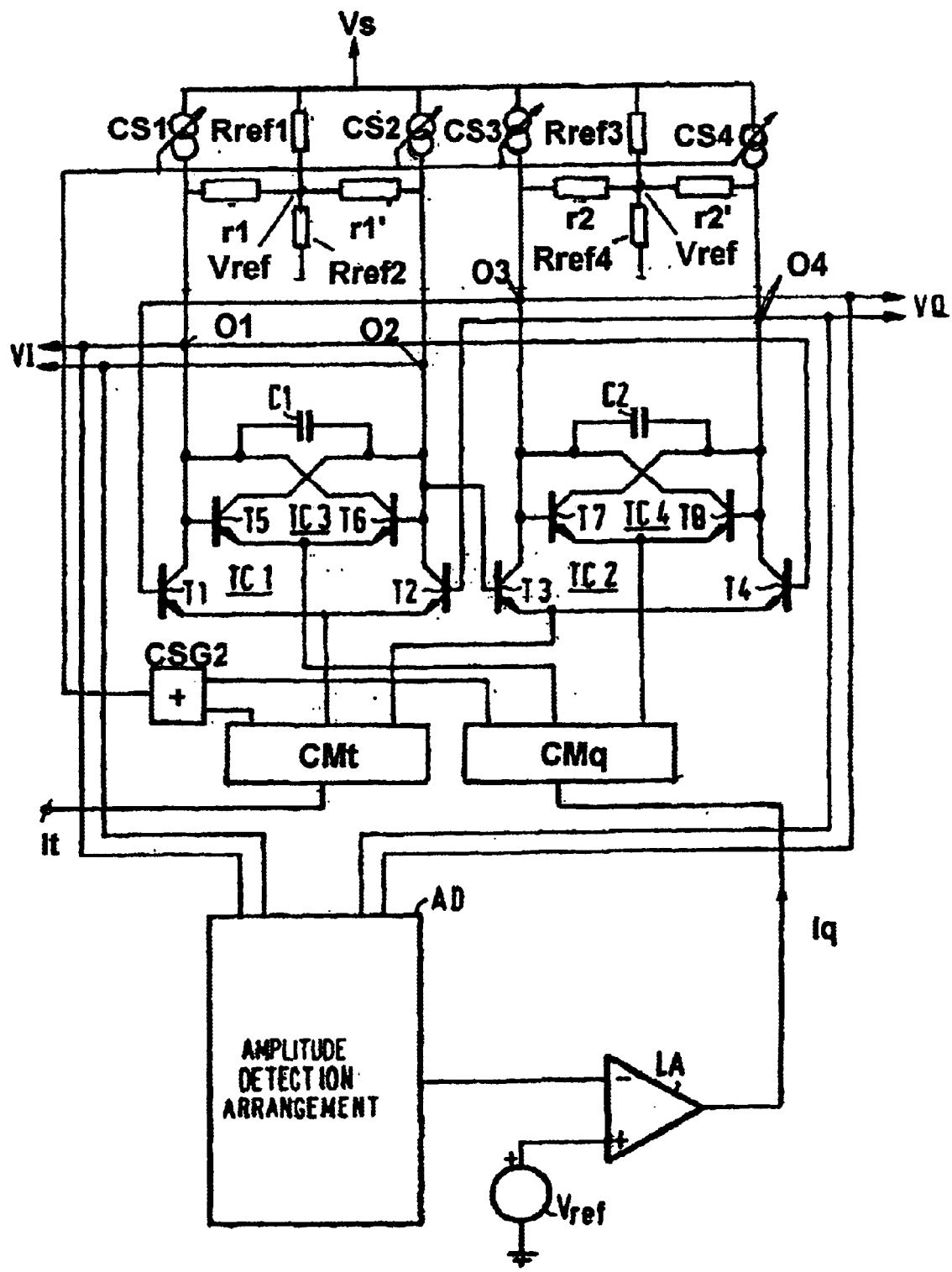
FIG. 3 is a schematic diagram of a second preferred embodiment of an oscillator circuit according to the invention having a DC feedforward loop.

FIG. 2 is a schematic diagram of a first preferred embodiment of the invention having a DC feedback loop providing an improvement of the oscillator circuit as shown in FIG. 3 of the above cited US patent. For an understanding of the functioning of the part of the oscillator corresponding to said known oscillator, reference is made to this US patent.

The oscillator according to the invention deviates from the known oscillator in that the first load resistors R1 is constituted by a serial arrangement of the above-mentioned mutually substantially equal resistances r1 and r1', which is coupled between the first and second output terminals O1 and O2 and in that the second load resistor R2 is constituted by a serial arrangement of the abovementioned mutually substantially equal resistances r2 and r2', which is coupled between the third and fourth output terminals O3 and O4. The abovementioned first to fourth DC current paths are provided between the first to fourth output terminals O1 to O4, respectively, shunting at least a substantial part of said tuning and gain control currents to said supply voltage. These DC current paths comprise first to fourth controlled DC current sources CS1 to CS4, respectively, said first and second controlled DC current sources CS1 and CS2 and said third and fourth controlled DC current sources CS3 and CS4 providing DC currents corresponding to substantially half the summation of said tuning and gain control currents It and Iq of each section TC1, TC3, R1C1 and TC2, TC4, R2C2. The first to fourth transconductance amplifiers TC1–TC4 are herein being constituted by transistorpairs T1 and T2; T3 and T4; T5 and T6; T7 and T8, respectively.

The DC voltage level variation at the common node between the resistances r1 and r1', hereinafter being referred to as node N1, represents the common mode variation at the first and second outputs O1 and O2, reflecting the variation in tuning and gain control currents passing through said first and second controlled DC current sources CS1 and CS2. Likewise, the DC voltage level variation at the common node between the resistances r2 and r2', hereinafter being referred to as node N2, represents the common mode variation at the third and fourth outputs O3 and O4 reflecting the variation in tuning and gain control currents passing through said third and fourth controlled DC current sources CS3 and CS4.

The DC voltage level at the respective nodes N1 and N2 are being used to measure the deviation thereof from a set voltage V set in respective first and second control signal generating devices CSG1 and CSG2. These voltage level deviations are negatively fed back to the control inputs of the first and second controlled DC current sources CS1 and CS2, respectively, to the control inputs of the third and fourth controlled DC current sources CS3 and CS4. This results in a suppression of said level deviations, i.e. in an accurate control of the first to fourth controlled DC current sources CS1 to CS4. The DC currents passing resistances r1, r1', r2 and r2' only need to be large enough for a proper operation of said feed back loop, which is in the order of magnitude of 1% of the DC currents passing these resistances in the known oscillator. This allows to substantially extend the tuning range of the oscillator without the need for increasing the supply voltage.

FIG. 3 is a schematic diagram of a second preferred embodiment of the invention having a DC feedforward loop providing an improvement of the oscillator circuit as shown in FIG. 3 of the above cited US patent. For the sake of clarity the current mirrors of the known oscillator constituted by the elements D1, CT1, CT2, on the one hand and D2, CT3, CT4 on the other hand are being included in basically similar current mirrors CMt and CMq, respectively. The current mirrors CMt and CMq differ from the current mirrors D1, CT1, CT2 and D2, CT3, CT4 of the known oscillator merely, in that they provide three, instead of two output currents. Where two of these three output currents are used in conformity with the two tuning control currents and the two gain control currents of the current mirrors D1, CT1, CT2 and D2, CT3, CT4 of the known oscillator, the third output current of the current mirror CMt—being identical to the tuning control current It—and the third output current of the current mirror CMq—being identical to the gain control current Iq and CMq—are summarised in a control signal generating device CSG2. The summation of these tuning and gain control currents It and Iq is supplied to control inputs of the first to fourth controlled DC current sources CS1–CS4, which are controlled to each provide a DC current corresponding to substantially half the summation of said tuning and gain control currents It and Iq of each section TC1, TC3 and TC2, TC4.

For a proper operation of so obtained feed forward loop, the voltage at the common nodes N1 and N2 have to be fixed at a reference voltage level, Vref, being provided e.g. by first and second voltage dividers R1, R2 and R3, R4.

While the invention has been particularly shown and described with reference to the preferred embodiments thereof, it will be understood by those skied in the art that various changes in form and details may be made without departing from the spirit and scope of the invention.

In particular, the controllable oscillator circuit according to the invention is in particular suitable for use as building block in integrated system concepts, because of the many parameters that can be varied easily. Where the set voltage Vset and the reference voltage Vref in respectively the first and second preferred embodiment of the invention, may be used to electronically align the resonance amplifier in supply voltage, DC common mode and/or working point to peripheral input and output signal processing circuits, the tuning control current It allow electronic alignment in oscillator frequency. In addition thereto, by a planary integrated implemention of the load resistors R1, R2 and C1, C2, respectively, as digitally controlled switched ladderstructures, further parameters are provided allowing easy alignment in impedance level.

What is claimed is:

1. Controllable oscillator circuit comprising
a regenerative loop which incorporates a cascade circuit of first and second sections each having a controllable gain and a phase shift which is 90° at the oscillation frequency,
the first and second sections comprising
first and second transconductance amplifiers, respectively,
outputs of which are coupled to third and fourth transconductance amplifiers, which are positively fed back from the output to the input, and via first and second capacitors to inputs of the second and first gain transconductance,
said first and second capacitors being coupled in parallel to first and second load resistors, respectively,
a tuning control current being supplied to control inputs of the first and second transconductance amplifiers, the output of at least one of the first and second transconductance amplifiers being coupled to an amplitude detection arrangement providing a gain control current for an automatic gain control to control inputs of the third and fourth transconductance amplifiers,
said first and third transconductance amplifiers of the first section having a differential pair of first and second output terminals in common,
said second and fourth transconductance amplifiers of the second section having a differential pair of third and fourth output terminals in common,
characterized by
said first and second load resistors being coupled between the first and second output terminals and the third and fourth output terminals, respectively,
said first to fourth output terminals being respectively coupled to first to fourth DC current paths shunting at least a substantial part of said tuning and gain control currents to a supply voltage.

2. Controllable oscillator circuit according to claim 1, characterized by
said first to fourth DC current paths comprising first to fourth controlled DC current sources, respectively,
said first and second controlled DC current sources and said third and fourth controlled DC current sources providing DC currents corresponding to substantially half the summation of said tuning and gain control currents of each section.

3. Controllable oscillator circuit according to claim 1, characterized in that
the first and second load resistors are constituted by a serial arrangement of a pair of mutually substantially equal resistances,
the DC voltage level at the common node between the resistances of said first and second load resistors being negatively fed back to control inputs of the respective first to fourth controlled DC current sources.

4. Controllable oscillator circuit according to claim 3, characterized in that
said common node is coupled to an input of a control signal generating device, comprising a comparator for comparing said DC voltage level with a set level to provide a current control signal to the respective first to fourth controlled DC current sources for a negative feedback of signal differences between said DC voltage level and said set level.

5. Controllable oscillator circuit according to claim 2, characterized by
gain and tuning current mirror means,
inputs thereof being supplied with said gain and tuning control currents, respectively,
outputs thereof coupled through summation means to control inputs of said first to fourth controlled DC current sources, respectively.

6. Controllable oscillator circuit according to claim 5, characterized in that the first and second load resistors are provided by a serial arrangement of a pair of mutually substantially equal resistances, the common node between the pair of resistances of said first and second load resistors being coupled to a reference voltage.

7. Controllable oscillator circuit according to claim 4, characterized in that said set level is being supplied through a set voltage level terminal for setting the oscillator circuit working point voltage level.

8. Controllable oscillator circuit according to claim 2, characterized in that the first and second load resistors are constituted by a serial arrangement of a pair of mutually substantially equal resistances, the DC voltage level at the common node between the resistances of said first and second load resistors being negatively fed back to control inputs of the respective first to fourth controlled DC current sources.

9. Controllable oscillator circuit according to claim 8, characterized in that said common node is coupled to an input of a control signal generating device, comprising a comparator for comparing said DC voltage level with a set level to provide a current control signal to the respective first to fourth controlled DC current sources for a negative feedback of signal differences between said DC voltage level and said set level.

10. Controllable oscillator circuit according to claim 9, characterized in that said set level is being supplied through a set voltage level terminal for setting the oscillator circuit working point voltage level.

11. Controllable oscillator circuit according to claim 6, characterized in that said reference voltage is being supplied through a set voltage level terminal for setting the oscillator circuit working point voltage level.

* * * * *